United States Patent
Pi et al.

(10) Patent No.: US 12,024,463 B2
(45) Date of Patent: Jul. 2, 2024

(54) HIGH-FLUX ULTRA-SENSITIVE DETECTION DOT ARRAY ENHANCEMENT CHIP

(71) Applicant: Jiangnan University, Wuxi (CN)

(72) Inventors: Fuwei Pi, Wuxi (CN); Ling Liu, Wuxi (CN); Ying Li, Wuxi (CN); Yuanyuan Zhang, Wuxi (CN); Ziye Yin, Wuxi (CN); Yuliang Cheng, Wuxi (CN); Lin Lin, Wuxi (CN); Xiulan Sun, Wuxi (CN)

(73) Assignee: JIANGNAN UNIVERSITY, Wuxi (CN)

( * ) Notice: Subject to any disclaimer, the term of this patent is extended or adjusted under 35 U.S.C. 154(b) by 937 days.

(21) Appl. No.: 17/066,549

(22) Filed: Oct. 9, 2020

(65) Prior Publication Data

US 2021/0147288 A1    May 20, 2021

Related U.S. Application Data

(63) Continuation of application No. PCT/CN2019/114545, filed on Oct. 31, 2019.

(30) Foreign Application Priority Data

Jan. 31, 2019    (CN) .......................... 201910098748.2

(51) Int. Cl.
    *C03C 17/09*    (2006.01)
    *C03C 17/00*    (2006.01)
    (Continued)

(52) U.S. Cl.
    CPC .............. *C03C 17/09* (2013.01); *C03C 17/00* (2013.01); *C03C 17/10* (2013.01);
    (Continued)

(58) Field of Classification Search
    CPC .... B21D 19/005; B21D 19/088; B21D 37/16; B21D 53/88; C03C 17/09; C03C 17/10;
    (Continued)

(56) References Cited

U.S. PATENT DOCUMENTS

| | | | |
|---|---|---|---|
| 2007/0285657 A1 | 12/2007 | Wang et al. | |
| 2011/0165341 A1* | 7/2011 | Mirkin ................... | B82Y 40/00 977/773 |

FOREIGN PATENT DOCUMENTS

| | | |
|---|---|---|
| CN | 103938158 A | 7/2014 |
| CN | 107478636 A | 12/2017 |

(Continued)

OTHER PUBLICATIONS

Zhuomin Gu, Fabrication and Raman Spectra of Two dimensional Ordered Gold Cavities, Thesis, Dec. 15, 2013, ISSN 1674-0246.

(Continued)

*Primary Examiner* — Tri T Ton
(74) *Attorney, Agent, or Firm* — IPRO, PLLC

(57) ABSTRACT

The disclosure discloses a high-flux and ultra-sensitive detection dot array enhancement chip, and belongs to the field of food safety detection. In the disclosure, single-layer Au nano-particles are chemically bonded onto a hydrophilic substrate, an Au nano-material is naturally deposited in holes of the chip under an electrostatic adsorption action, and a regular dot array is formed. Au particles distributed in the holes are separated with a particle surfactant (CTAB) to form plasma gaps so as to enhance the self-assemble of Au nano-particles distributed on hot-spots for a long range effect, thereby improving the sensing signal in detection efficiency and sensitivity of the chip.

1 Claim, 4 Drawing Sheets
Specification includes a Sequence Listing.

(51) Int. Cl.
- *C03C 17/10* (2006.01)
- *C03C 23/00* (2006.01)
- *C23C 14/02* (2006.01)
- *C23C 14/18* (2006.01)
- *C23C 14/35* (2006.01)
- *C23C 14/58* (2006.01)
- *G01N 21/64* (2006.01)
- *G01N 21/65* (2006.01)

(52) U.S. Cl.
CPC ........ *C03C 23/0075* (2013.01); *C23C 14/021* (2013.01); *C23C 14/185* (2013.01); *C23C 14/35* (2013.01); *C23C 14/58* (2013.01); *G01N 21/6428* (2013.01); *G01N 21/65* (2013.01); *C03C 2218/11* (2013.01); *C03C 2218/156* (2013.01); *C03C 2218/31* (2013.01); *C03C 2218/328* (2013.01)

(58) Field of Classification Search
CPC ........... C03C 2218/11; C03C 2218/156; C03C 2218/31; C03C 2218/328; C03C 23/0075; C03C 17/00; C03C 17/06; C03C 2217/42; C03C 2218/355; C23C 14/021; C23C 14/185; C23C 14/35; C23C 14/58; G01N 21/6428; G01N 21/65; G01N 21/6458; G01N 21/658; B82Y 15/00; B82Y 30/00; G06N 3/08; G06V 10/40; G06V 10/82; G06V 30/1448; G06V 30/19147; G06V 30/19173; G06V 30/26; G06V 30/40
USPC .................................................. 356/300–334
See application file for complete search history.

(56) References Cited

FOREIGN PATENT DOCUMENTS

| | | | |
|---|---|---|---|
| CN | 108037100 A | | 5/2018 |
| CN | 108642513 A | * 10/2018 | ............... C25B 1/04 |
| CN | 109781705 A | | 5/2019 |

OTHER PUBLICATIONS

Sun J et. al., Ultrasensitive "FRET-SEF" Probe for Sensing and Imaging MicroRNAs in Living Cells Based on Gold Nanoconjugates, Analytical Chemistry, 2019, 90, 3099-3108, Published Jan. 8, 2018.

* cited by examiner

HIGH-FLUX ULTRA-SENSITIVE DETECTION DOT ARRAY ENHANCEMENT CHIP

TECHNICAL FIELD

The disclosure relates to a high-flux and ultra-sensitive detection dot array enhancement chip, and belongs to the field of food safety detection.

BACKGROUND

In recent years, pollution, detection and control issues of biotoxin, heavy metals and other substances are long-standing concerns in food safety in China and are also hot-spot issues on people health at the national level which attract much attention. Traditional toxin detection methods such as high-performance liquid chromatography and thin-layer chromatography have certain shortages in the aspects of detection time, detection precision, device cost, operability and the like and less involve in valid toxicity identification and high-flux quick detection of biotoxin degradation products in the food processing process, and especially there is a lack of technologies and detection apparatuses matched with potential hazard toxicity high-flux quick detection such as biotoxin reduction and degradation. Although there are advantages, the existing detection technologies still have many problems of low detection sensitivity, high detection limit and monotonous detection target.

Surface plasma enhancement refers to a phenomenon that structure signals of analyte adsorbed to a specific nano-scale rough interface are greatly enhanced, and it has been confirmed that the enhancement mechanism thereof is a "hot-spot" effect that regional electromagnetic fields between adjacent nano-particles are coupled to form "hot-spot" with overlapped surface electron clouds ("hot-spots" are regions where local electromagnetic fields of adjacent metal nano-particles are coupled to greatly enhance analyte signals). Due to the finding of a plasma enhancement "hot-spot" effect and the quick development of a "hot-spot" substrate preparation method, a regional plasma technology has already been widely applied to research fields of chemistry, analysis, biology and the like. In recent years, studies show that compared with one-dimensional (1D) "hot-spots" formed with dimer and trimer nano-particles, local plasma "hot-spot" enhancement arrays of two-dimensional (2D) and three-dimensional (3D) structures greatly enhance overall plasma signals and keep a signal enhancement effect more stable and lasting due to their long range effect and increased number. Though the three-dimensional "hot-spot" array has independent light scattering and many space enhancement local fields, the regional orderly two-dimensional "hot-spot" array that is self-assembled by particles is easier to actually control and apply due to its polarized light effect and interface orderliness.

SUMMARY

The disclosure provides a preparation technology of a high-flux and multi-targeted signal enhancement detection array chip. Single-layer Au nano-particles (different forms of Au-base nano-materials such as an Au nanosphere, an Au nano-rod or an Au nano-cross) are chemically bonded onto a hydrophilic substrate, the Au nano-particles used are naturally deposited in holes of the chip under an electrostatic adsorption action, and a regular dot array is formed. Au particles distributed in the holes are partitioned by a particle surfactant to form plasma regions so as to enhance self-assemble of the Au nano-particles distributed on hot-spots to form a long range effect, thereby improving the detection efficiency and sensitivity.

The first objective of the disclosure is to provide a preparation method of a high-flux, ultra-sensitive and multi-targeted detection regional plasma signal enhancement dot array chip, comprising the following steps:
(1) dispersing a microsphere solution on a chip substrate to form a single-layer microsphere dot array, and naturally air-drying to form a substrate with the microsphere dot array;
(2) evaporating an Al-film on the substrate with the microsphere dot array in Step (1) to imprint an arrangement morphology of the microsphere dot array, wherein a thickness of the Al-film does not exceed a radius of microspheres;
(3) ultrasonically cleaning the substrate subjected to evaporation of the Al-film in Step (2) to remove the microspheres so as to prepare a chip substrate of which the surface is covered with the Al-film with micro-nano holes;
(4) performing silanization treatment on the surface of the chip substrate processed in Step (3) so as to make substrate interfaces in the processed micro-nano holes carry positive charges or negative charges; and
(5) dropping an Au nano-material onto the surface of the substrate processed in Step (4) to make the Au nano-material deposit and self-assemble in the micro-nano holes of the substrate and removing the Al-film so as to obtain the Au nano-particle assembled dot array chip with a micro-scale plasma enhancement effect.

In one embodiment, the chip substrate is a hydrophilic substrate.

In one embodiment, a material of the chip substrate includes, but not limited to, a glass sheet, a silicon wafer or a semiconductor.

In one embodiment, a form of the Au nano-material includes, but not limited to, an Au nanosphere, an Au nano-rod or an Au nano-cross.

In one embodiment, a particle surfactant (CTAB) is provided on surfaces of the Au nano-particles.

In one embodiment, in Step (1), the microsphere solution is spread onto the glass sheet and naturally air-dried to form the single-layer microsphere dot array. In order to ensure the stable continuous signal enhancement effect between the distributed Au nano-particles and perform further functionalization, the step of distributing the microspheres onto the glass sheet and form a single layer is quite important.

In one embodiment, in Step (2), Al-film is evaporated in a magnetron sputtering instrument, and a thickness of the Al-film is from 50 nm to 100 nm.

In one embodiment, in Step (4), the glass sheet subjected to ultrasonic cleaning is vacuum-dried at 0.08-0.12 MPa and then subjected to evaporation of APTES or APTMS at 70° C. for 0.8-1.2 h.

In one embodiment, the microspheres are $SiO_2$ microspheres.

In one embodiment, a diameter of the microspheres is 2 μm.

In one embodiment, the chip substrate is cleaned through the following specific steps:
(1) ultrasonically cleaning the chip substrate with AR or HPLC grade ethyl alcohol and ultrapure water for 20-30 min; and (2) drying the chip substrate cleaned in Step (1), and then cleaning the chip substrate in a plasma cleaning machine for 10-15 min.

In one embodiment of the disclosure, the microspheres are cleaned through the steps of sucking 150 μL of $SiO_2$ microspheres by a pipette, cleaning the microspheres 5 times with ultrapure water by a deceleration gradient centrifugal method, and diluting the cleaned microspheres to a concentration of 0.5-1.0 mol/L.

In one embodiment, in the method, the Au nano-rod or Au nano-cross is coupled with a marker DNA and deposited in micro-nano holes in the surface of the chip substrate.

In one embodiment, the method includes the following specific steps:
(a) keeping 100 uM ssDNA and 1 mM TCEP stand for 3 h out of light, and adding 0.1 M Au nano-rod or Au nano-cross;
(b) adding an SDS-HCl solution to the system in Step (a), oscillating at room temperature for 12 h, centrifuging and collecting precipitates; and
(c) adding 0.005 M CTAB to the precipitates, and then depositing in the holes of the chip.

In one embodiment, the marker DNA is DNA1 or DNA2, where

```
DNA1:
5'-HS-C6-AAAAAATCAACATCAGTCTGATAAGCTA-3'

DNA2:
5'-HS-C6-AAAAAAAAAAAAAAAATAGCTTATCAGACT-cy5-3'.
```

The second objective of the disclosure is to provide the chip prepared through the method.

In one embodiment, the chip has a dot array in a form of assemble of Au nano-particles, and the Au nano-particles are connected with a nucleotide sequence capable of capturing to-be-detected mRNA.

The disclosure further claims to protection of application of the chip to detection in fields of chemistry, analysis and biology.

Beneficial effects: the disclosure provides the high-flux, ultras-sensitive and multi-targeted detection dot array enhancement chip, and the chip may improve the detection signal sensitivity by $10^2$ times and reduce the detection limit to an aM level.

DETAILED DESCRIPTION

Example 1 Preparation of Chip

Figure 1:
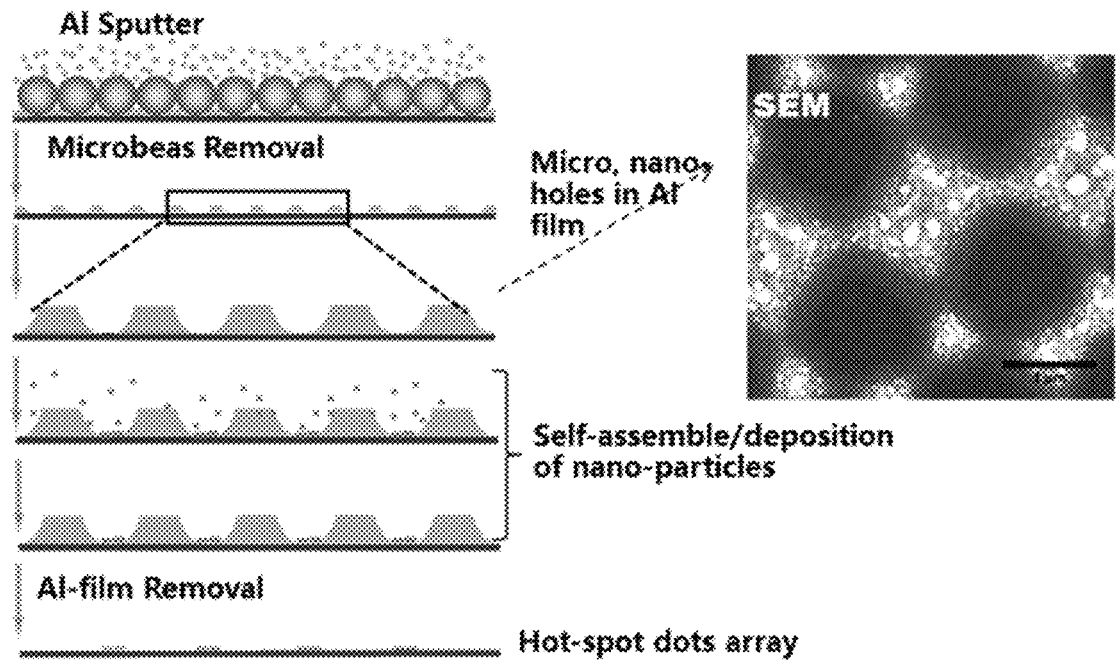
FIG. 1 shows a flow diagram of preparation of a "hot-spot" enhancement array chip substrate based on a microsphere etching dot array technology and a scanning electron microscope (SEM) image of holes of a chip after microsphere removal.
Figure 2A:
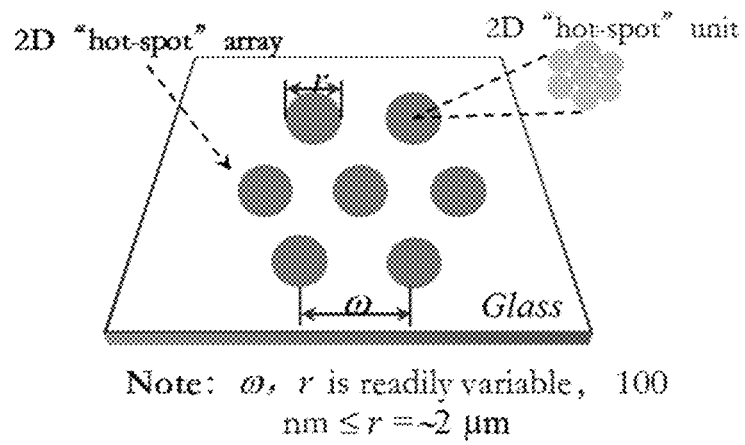
FIG. 2A is a schematic diagram of a glass substrate plasma "hot-spot" enhancement array chip.
Figure 2B:
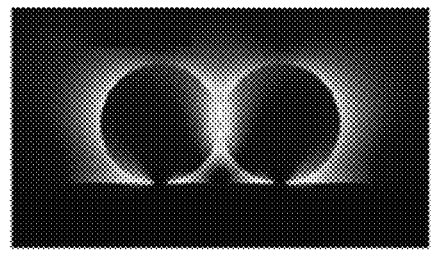
FIG. 2B is a simulation diagram of nano-particle regional plasma enhancement.
Figure 3:
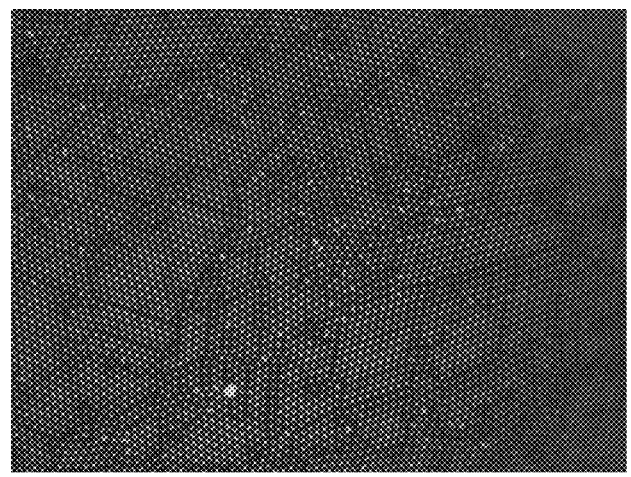
FIG. 3 is an inverted fluorescence microscope image (10×100) of chip holes marked with FITC-BSA.
Figure 4:
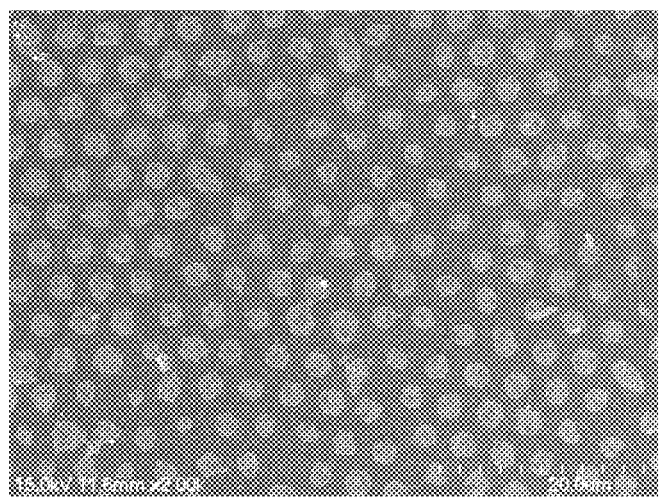
FIG. 4 is an SEM image of a nano-Au "hot-spot" dot array.

As shown in FIG. 1, FIG. 2A and FIG. 2B, the chip of the disclosure is prepared through the following steps:

(1) cleaning a glass sheet and microspheres: the glass sheet is ultrasonically cleaned with absolute ethyl alcohol and ultrapure water for 30 min, the cleaned glass sheet is dried and then cleaned in a plasma cleaning machine for 15 min, and the cleaned glass sheet is preserved in ultrapure water;

(2) distributing the microspheres at fixed points on a glass interface: 50 μL of a microsphere solution with a concentration of 1 mol/L and a diameter of 2 μm is sucked by a pipette to drop onto the glass sheet, when the microsphere solution is diffused to the bottom of the glass sheet, the glass sheet is inclined by 4 degrees, and rotate 180° along the bottom to the top to make part of the microsphere solution reflux to form a larger monolayer microsphere array;

(3) the glass sheet is aluminized in a magnetron sputtering instrument to fix positions of the microspheres, and a thickness of an Al-film is regulated and controlled to be 50 nm by regulating an evpoaration time and an evaporation rate;

(4) ultrasonically cleaning the glass sheet subjected to evaporation of the Al-film in ultrapure water to remove the microspheres on the interface so as to obtain a chip substrate of which the surface is covered with the Al-film with micro-nano holes, and taking an SEM image of the glass sheet;

(5) sealing the chip processed in Step (4) in APTES vapor, and performing silanization treatment on the surface of the substrate so as to make substrate interfaces in the processed micro-nano holes carry positive charges or negative charges; and (6) making the Au nano-particles drop onto the surface of the substrate processed in Step (5) to make the Au nano-particles deposit and self-assemble in the micro-nano holes of the substrate and removing the Al-film so as to obtain the Au nano-particle assembled dot array chip with a micro-scale plasma enhancement effect.

Figure 5A:
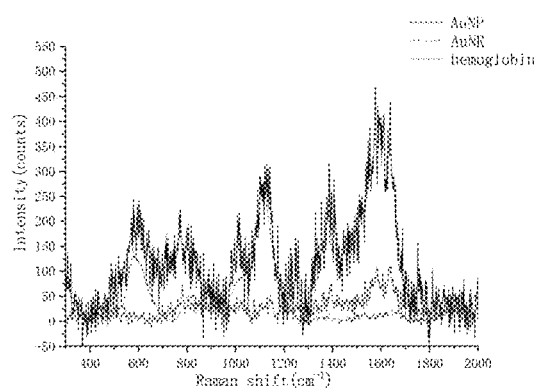
FIG. 5A is a single-dot scanning image of Raman signals of an Au nano-rod and Au nanosphere "hot-spot" dot array chip.
Figure 5B:
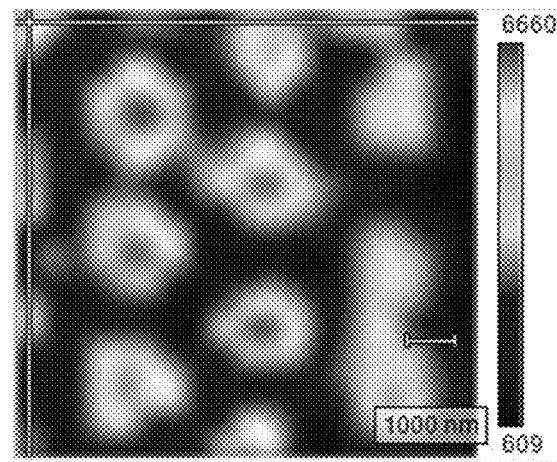
FIG. 5B is a regional Mapping scanning image with an R6G molecule as a probe of an Au nano-rod and Au nanosphere "hot-spot" dot array chip.
Figure 5C:
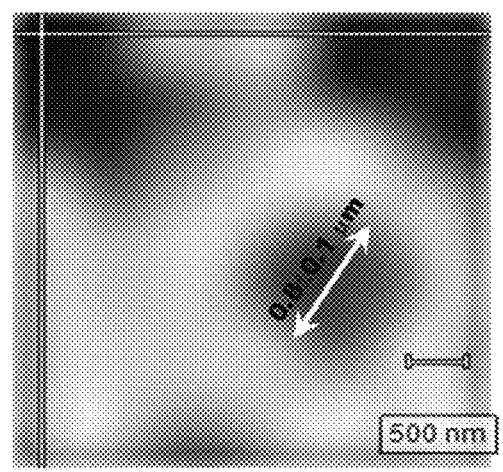
FIG. 5C shows a size of plasma regions of the Au nano-rod and Au nanosphere "hot-spot" dot array chip.

Example 2 Detection of Raman signals of Au Nano-Rod (AuNR) and Au Nanosphere (AuNP) on Chip The synthesized Au nano-rod (AuNR) and the synthesized Au nanosphere (AuNP) are deposited in nano-holes, the Au nano-rod can self-assemble in the holes to form a signal enhancement "hot-spot" dot array, then 200 μL of a hemoglobin Raman probe molecule is then added and ultrasonically shaken up, and the chip dot array is subjected to Raman signal detection after 1 h of depositing action. Detection settings are an exciting light wavelength of 532 nm and an exposure time of 0.5 s, and a dot array enhancement effect is calculated with spectrum peak intensity data. Detection results are as shown in FIG. 5A, and the results show that compared with pure hemoglobin molecules, the AuNR and AuNP dot array shows enhanced signals at both wavelengths of 600 cm$^{-1}$ and 1121 cm$^{-1}$, and AuNP also shows enhanced signals at a wavelength of 1600 cm$^{-1}$. After calculation, an enhancement effect of the chip can reach 10$^2$ times. As shown in FIG. 5B and FIG. 5C, it could be found that with the R6G as the Raman probe molecule, by performing regional plasma enhancement Mapping testing with 532 nm exciting light, the Au nano-particles at an assemble state presents a signal enhancement micro-regional distribution state. A plasma molecule signal enhancement region is expanded from a traditional slit nano-scale to about 0.8 μm, and meanwhile an optimal enhancement factor is larger than 10$^9$. It can be seen that the chip has a good plasma amplification property and a molecule signal enhancement property.

Example 3 Detection of Pathogenic Microorganism microRNA

An Au nano-rod or Au nano-cross is coupled with DNA according to the following steps, where the Au nano-cross is coupled with DNA1 and the Au nano-rod is coupled with DNA2:
1. adding equal volumes of 100 uM ssDNA and 1 mM TCEP into a PCR tube to stand for 3 h out of light and activate DNA;
2. sucking 1 mL of a 0.1 M Au nano-rod or Au nano-cross;
3. sucking an equal volume of SDS-HCl (pH=3) as Step 1, and adding to the material in Step 2;
4. performing oscillating at room temperature for 12 h at 1000 rpm; and
5. performing centrifuging for 10 min at 1000 rpm, sucking supernate, and adding 0.005 M CTAB to precipitates for use.

Figure 6:
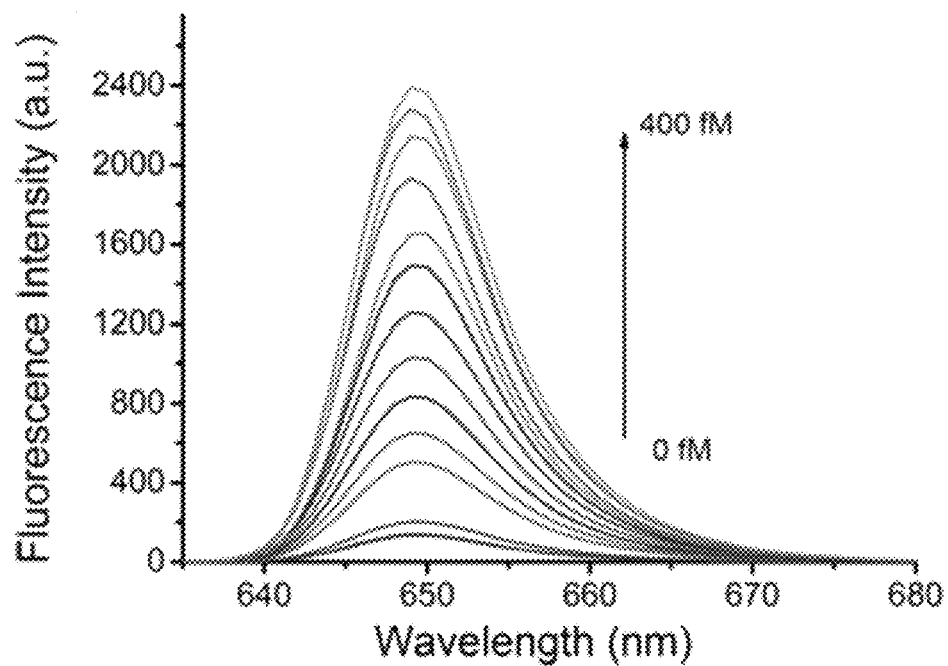
FIG. 6 shows fluorescence reactions detected by a chip prepared in Examples at various miRNA-21 concentrations, and curves from bottom to top in FIG. 6 represent miRNA-21 concentrations of 0, 0.00001, 0.00008, 0.0002, 0.0003, 0.0006, 0.0008, 0.0013, 0.001, 0.0016, 0.005, 0.1, 1, 10, 50, 100, 150, 200 and 400 fM respectively.
Figure 7:
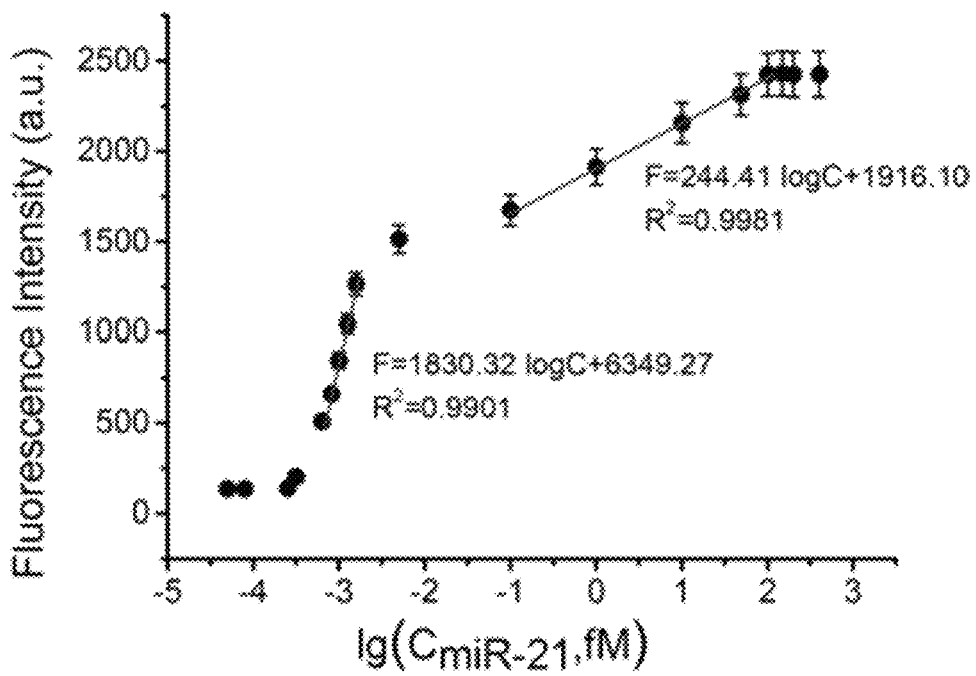
FIG. 7 shows dependence of a fluorescence intensity to a logarithm of a miRNA-21 concentration within a linearity range of 0.0006-0.0016 fM and a linearity range of 0.1-100 fM, each datum is an average value (N=3) of three repeats, and an error bar represents a standard deviation of measurement.

The Au nano-cross connected with the DNA1 and the Au nano-rod coupled with the DNA2 are deposited in holes of the chip prepared by the method of Example 1 according to a same molar weight, and in order to facilitate observation, a chain end of the DNA1 is modified with a cy5 fluorescence dye molecule in advance by a click reaction technology. In addition, the Au nano-rod is connected with the DNA2, part of basic groups of the DNA1 and the DNA2 are in complementary pairing, and at the moment, a cy5 fluorescence dye does not emit light and is at a quenched state. When pathogenic microorganism miRNA-21 is added, since part of basic groups of the RNA and the DNA1 are in complementary pairing, the DNA1 coupled with the Au nano-rod and RNA are hybridized, cy5 fluorescence of the DNA2 coupled with the Au nano-cross is released, the pathogenic microorganism miRNA-21 could be detected according to a fluorescence intensity of cy5. Detection results are as shown in FIG. 6, and it is shown in FIG. 7 that curves of a fluorescence intensity to a logarithm of an miRNA-21 concentration present two linear responses represented by equations (F=1830.32 logC+6349.27, R$^2$=0.9901; and F=244.41 logC+1916.10, R$^2$=0.9984); and a detection limit can be as low as 0.5 aM and 0.03 fM, which shows that the chip has a high-flux characteristic and an ultra-sensitive characteristic.

The DNA1, DNA2 and microRNA sequences used are all purchased from Shanghai Bioengineering Co., LTD.

DNA1:
(SEQ ID NO. 1)
5'-HS-C6-AAAAAATCAACATCAGTCTGATAAGCTA-3'

DNA2:
(SEQ ID NO. 2)
5'-HS-C6-AAAAAAAAAAAAAAAATAGCTTATCAGACT-cy5-3' miRNA-21:
(SEQ ID NO. 3)
5'-UAGCUUAUCAGACUGAUGUUGA-3'

Comparative Example 1

The specific embodiment is the same as Example 2 except that the Au nano-material is not deposited in nano-holes, 200 μL of Raman probe molecule hemoglobin is directly added to a solution of equal amounts of Au nano-rod (AuNR) and Au nanosphere (AuNP), and ultrasonically shaken up. Raman signals are detected, results are as shown in FIG. 8, and compared with the effect of FIG. 5A of the dot array chip, Raman signals in the solution are weakened by 10 times.

What is claimed is:

1. A method of use of a dot array chip for detection of a signal,
wherein the dot array chip has a dot array in a form of assembly of Au nano-particles, and particle assemble spots present a plasma enhancement effect in a form of signal enhancement micro-regional spots;
wherein the method comprises placing a to-be-detected sample onto the dot array chip to detect a fluorescence intensity, wherein the dot array chip is a Au nano-particle dot array connected with a nucleotide sequence capable of capturing to-be-detected mRNA; wherein the Au nano-particle dot array is in a form of assembly of Au nano-particles, and particle assemble spots present a plasma enhancement effect in a form of signal enhancement micro-regional spots.

* * * * *

SEQUENCE LISTING

<160> NUMBER OF SEQ ID NOS: 3

<210> SEQ ID NO 1
<211> LENGTH: 28
<212> TYPE: DNA
<213> ORGANISM: Artificial sequence
<220> FEATURE:
<223> OTHER INFORMATION: Synthetic DNA

<400> SEQUENCE: 1
aaaaaatcaa catcagtctg ataagcta                                    28

<210> SEQ ID NO 2
<211> LENGTH: 30
<212> TYPE: DNA
<213> ORGANISM: Artificial Sequence
<220> FEATURE:
<223> OTHER INFORMATION: Synthetic DNA -continued

```
<400> SEQUENCE: 2
aaaaaaaaaa aaaaaatagc ttatcagact                                30

<210> SEQ ID NO 3
<211> LENGTH: 22
<212> TYPE: RNA
<213> ORGANISM: Artificial Sequence
<220> FEATURE:
<223> OTHER INFORMATION: Synthetic RNA

<400> SEQUENCE: 3
uagcuuauca gacugauguu ga                                        22
```